(12) United States Patent
Marin et al.

(10) Patent No.: US 12,224,103 B2
(45) Date of Patent: Feb. 11, 2025

(54) ANGLED INDUCTOR WITH SMALL FORM FACTOR

(71) Applicant: Intel Corporation, Santa Clara, CA (US)

(72) Inventors: Brandon Marin, Gilbert, AZ (US); Jeremy Ecton, Gilbert, AZ (US); Suddhasattwa Nad, Chandler, AZ (US); Matthew Tingey, Mesa, AZ (US); Ravindranath Mahajan, Chandler, AZ (US); Srinivas Pietambaram, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 729 days.

(21) Appl. No.: 17/348,580

(22) Filed: Jun. 15, 2021

(65) Prior Publication Data
US 2022/0399150 A1    Dec. 15, 2022

(51) Int. Cl.
*H05K 1/02* (2006.01)
*G11B 5/17* (2006.01)
(Continued)

(52) U.S. Cl.
CPC ....... *H01F 27/2804* (2013.01); *H01F 27/324* (2013.01); *H01L 23/49838* (2013.01); *H01L 25/18* (2013.01)

(58) Field of Classification Search
CPC ........ H05K 1/02; H05K 1/0268; H05K 1/028; H05K 1/111; H05K 3/28; H05K 3/285; H05K 3/3485; H05K 3/4007; H05K 3/4015; H01L 21/822; H01L 23/481; H01L 23/645; H01L 23/3128; H01L 23/49816; H01L 23/49822; H01L 23/49827; H01L 23/49838; H01L 23/5227; H01L 24/08; H01L 24/80; H01L 25/0655; H01L 25/0657; H01L 25/16; H01L 25/18; H01L 25/167; H01L 27/01; H01L 27/04;
(Continued)

(56) References Cited

U.S. PATENT DOCUMENTS

2003/0151849 A1* 8/2003 Sasaki ................. G11B 5/3136
                                                          360/123.28
2020/0064738 A1    2/2020 Liu et al.
(Continued)

*Primary Examiner* — Xiaoliang Chen
(74) *Attorney, Agent, or Firm* — Essential Patents Group, LLP

(57) ABSTRACT

An electronic substrate may be fabricated having a dielectric material, metal pads embedded in the dielectric material with co-planar surfaces spaced less than one tenth millimeter from each other, and a metal trace embedded in the dielectric material and attached between the metal pads, wherein a surface of the metal trace is non-co-planar with the co-planar surfaces of the metal pads at a height of less than one millimeter, and wherein sides of the metal trace are angled relative to the co-planar surfaces of the metal pads. In an embodiment of the present description, an embedded angled inductor may be formed that includes the metal trace. In an embodiment, an integrated circuit package may be formed with the electronic substrate, wherein at least one integrated circuit devices may be attached to the electronic substrate. Other embodiments are disclosed and claimed.

9 Claims, 10 Drawing Sheets

(51) Int. Cl.
  *H01F 17/02* (2006.01)
  *H01F 27/23* (2006.01)
  *H01F 27/28* (2006.01)
  *H01F 27/32* (2006.01)
  *H01L 21/822* (2006.01)
  *H01L 23/498* (2006.01)
  *H01L 25/16* (2023.01)
  *H01L 25/18* (2023.01)
  *H01L 27/01* (2006.01)
  *H01L 27/04* (2006.01)
  *H01L 27/32* (2006.01)
  *H05K 3/28* (2006.01)

(58) Field of Classification Search
  CPC ... H01L 27/32; H01L 27/323; H01L 27/2804; H01L 28/10; H01F 17/0013; H01F 17/0033; H01F 17/02; H01F 17/32; H01F 17/292; H01F 17/2828; H01F 27/23; H01F 27/324; H01F 27/2804; H01F 37/005; G11B 5/17; G11B 5/313; G11B 5/3109; G11B 5/3136; G11B 5/3163; G11B 5/3906; G11B 5/3967
  USPC .......... 361/782; 360/123.25, 123.28, 123.31, 360/125.5, 125.58, 125.68, 317; 455/41.1
  See application file for complete search history.

(56) References Cited

U.S. PATENT DOCUMENTS

| | | | |
|---|---|---|---|
| 2023/0060320 A1* | 3/2023 | Yoshioka | H01F 27/32 |
| 2023/0123423 A1* | 4/2023 | Gao | H01L 24/80 |
| | | | 257/428 |
| 2024/0088199 A1* | 3/2024 | Marin | H01F 17/0013 |
| 2024/0222353 A1* | 7/2024 | Higuchi | H01L 27/04 |
| 2024/0288745 A1* | 8/2024 | Lu | H01L 23/3128 |

* cited by examiner

ANGLED INDUCTOR WITH SMALL FORM FACTOR

TECHNICAL FIELD

Embodiments of the present description generally relate to the field of integrated circuit package fabrication, and, more specifically, to an integrated circuit package including embedded inductors.

BACKGROUND

The integrated circuit industry is continually striving to produce ever faster, smaller, and thinner integrated circuit packages for use in various electronic products, including, but not limited to, computer servers and portable products, such as portable computers, electronic tablets, cellular phones, digital cameras, and the like.

As a part of this effort, integrated circuit packages containing multiple integrated circuit devices, such as microelectronic dice, have been developed. These multiple integrated circuit device packages are referred to in the art as multi-device, multi-chip packages (MCPs), or partitioned devices, and offer the potential for increased architectural flexibility at reduced cost, but must do so such that appropriate integrated circuit device-to-integrated circuit device interconnect densities are provided. As will be understood to those skilled in the art, interconnect density is an important consideration because an insufficient number of integrated circuit device connections would limit the bandwidth capability for the affected integrated circuit device interface, and thus would reduce the communication efficiency and capability between integrated circuit devices.

Integrated passive devices or embedded passive devices include electronic components such as resistors, capacitors, inductors, etc., that are integrated in the same package or on the same substrate. The passive devices are implemented in between dielectric layers or on the same substrate. For example, an integrated circuit package substrate may include embedded air core inductors. The substrates have a thermal conductor for the inductors. One example includes a package substrate to carry an integrated circuit die, where the package substrate has top side pads to connect to the die on a top side and bottom side pads to connect to an external component on a bottom side. An inductor is embedded within the package substrate, a thermal conductor is embedded within the package substrate adjacent to the inductor to conduct heat away from the inductor, and a heat sink is thermally coupled to the thermal conductor to receive the heat from the conductor.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

Figure 1:
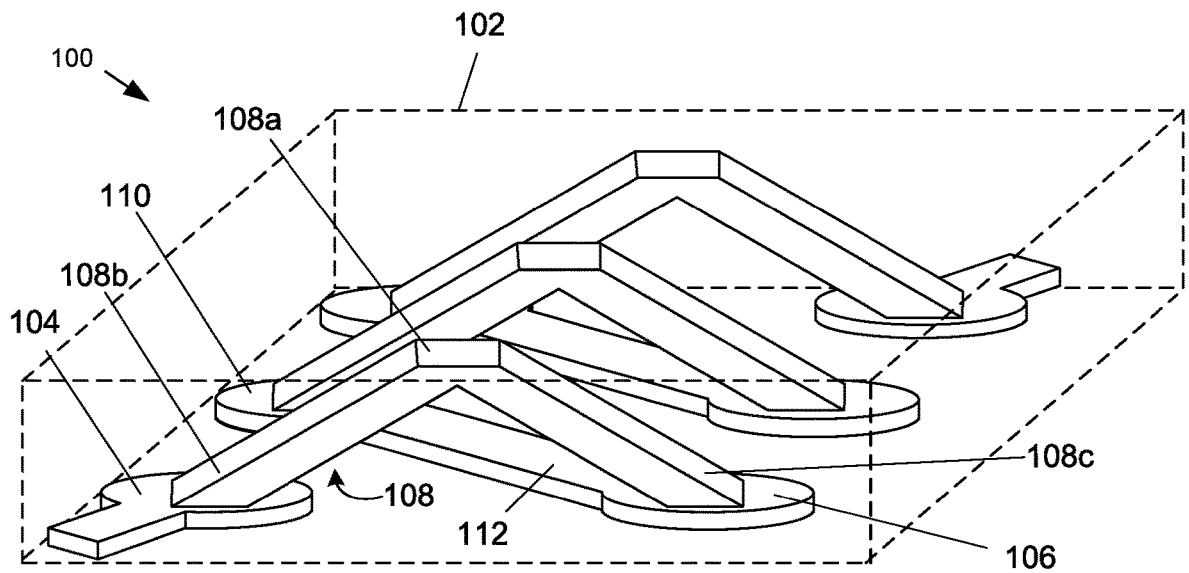
FIGS. 1 and 2 are perspective and top views of an angled inductor, according to one embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, patch, or characteristic described herein, in connection with one embodiment, may be implemented within other embodiments without departing from the spirit and scope of the claimed subject matter. References within this specification to "one embodiment" or "an embodiment" mean that a particular feature, patch, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The term "package" generally refers to a self-contained carrier of one or more dice, where the dice are attached to the package substrate, and may be encapsulated for protection, with integrated or wire-boned interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit.

Here, the term "cored" generally refers to a substrate of an integrated circuit package built upon a board, card or wafer comprising a non-flexible stiff material. Typically, a small printed circuit board is used as a core, upon which integrated circuit device and discrete passive components may be soldered. Typically, the core has vias extending from one side to the other, allowing circuitry on one side of the core to be coupled directly to circuitry on the opposite side of the core. The core may also serve as a platform for building up layers of conductors and dielectric materials.

Here, the term "coreless" generally refers to a substrate of an integrated circuit package having no core. The lack of a core allows for higher-density package architectures, as the through-vias have relatively large dimensions and pitch compared to high-density interconnects.

Here, the term "land side", if used herein, generally refers to the side of the substrate of the integrated circuit package closest to the plane of attachment to a printed circuit board, motherboard, or other package. This is in contrast to the term "die side", which is the side of the substrate of the integrated circuit package to which the die or dice are attached.

Here, the term "dielectric" generally refers to any number of non-electrically conductive materials that make up the patch of a package substrate. For purposes of this disclosure, dielectric material may be incorporated into an integrated circuit package as layers of laminate film or as a resin molded over integrated circuit dice mounted on the substrate.

Here, the term "metallization" generally refers to metal layers formed over and through the dielectric material of the package substrate. The metal layers are generally patterned to form metal patches such as traces and bond pads. The metallization of a package substrate may be confined to a single layer or in multiple layers separated by layers of dielectric.

Here, the term "bond pad" generally refers to metallization patches that terminate integrated traces and vias in integrated circuit packages and dies. The term "solder pad" may be occasionally substituted for "bond pad" and carries the same meaning.

Here, the term "solder bump" generally refers to a solder layer formed on a bond pad. The solder layer typically has a round shape, hence the term "solder bump".

Here, the term "substrate" generally refers to a planar platform comprising dielectric and metallization patches. The substrate mechanically supports and electrically couples one or more IC dies on a single platform, with encapsulation of the one or more IC dies by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

Here, the term "assembly" generally refers to a grouping of parts into a single functional unit. The parts may be separate and are mechanically assembled into a functional unit, where the parts may be removable. In another instance, the parts may be permanently bonded together. In some instances, the parts are integrated together.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, magnetic or fluidic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

Some embodiments provide technology for an angled inductor architecture with a small form factor. Passives (e.g., such as resistors, inductors, capacitors, etc.) are important devices in semiconductor packaging used for the modulation, conversion, and/or storage of electrical signals. With regards to inductors, some technology for adding inductors to packages center on either embedding inductor loops into the core of the substrate package or mounting pre-fabricated discrete inductors onto the package. As design rules continue to shrink in semiconductor packaging, so does the availability of space for passives such as inductors. Thus, methods of fabricating inductors with small form factor within the dielectric build-up layers are needed to enable greater flexibility in design/device integration.

Some embodiments provide inexpensive and scalable technology for fabricating small form factor inductors which can be embedded within a single build-up layer. In some embodiments, a small form factor inductor may be fabricated with relatively high inductance values (e.g., corresponding to inductance densities of about 35-40 $nH/mm^2$ or more) as compared to an inductor embedded in a core (e.g., with an inductance density range of about 3-7 nH/mm²). Embodiments of an embedded inductor may include an angled structure, that may provide flexibility in design.

In some embodiments, an angled inductor geometry is patterned to be embedded directly into the substrate package within dielectric build-up layers of the package. Some embodiments provide technology for an angled geometry to embed an inductor within a single dielectric build-up film (BUF) layer. Advantageously, some embodiments of an inductor enable greater flexibility in regards to device integration within the package because the inductor may be patterned in parallel with standard semi-additive process (SAP) redistribution layer (RDL) layer patterning and the inductor may be small in form factor (e.g., some embodiments may be embedded within a single build up layer).

In one example of a low form factor inductor, inductor loops may be embedded within any dielectric build up layer of the substrate package, thereby enabling greater flexibility with regards to device integration into the substrate. For example, inductors can be placed in close proximity to an integrated circuit (IC) die for improved performance. Additionally, embodiments of technology to fabricate an inductor geometry may provide a simpler fabrication process as compared to other approaches related to embedding inductor loops within the substrate package RDLs (e.g., which may require three or more lithography steps). In contrast, as described in more detail below, some embodiments may utilize only two lithography steps to fabricate an inductor loop. Accordingly, some embodiments may provide lower cost and/or higher performing products. Additionally, embodiments of an inductor embedded within the build-up layer may free up valuable package area in the adjacent (e.g., top side) metallization layer. Embodiments may also achieve higher self-inductance and inductance density values (e.g., an order of magnitude higher than some other self-inductance values for inductors fabricated in the core of the substrate).

Figure 2:
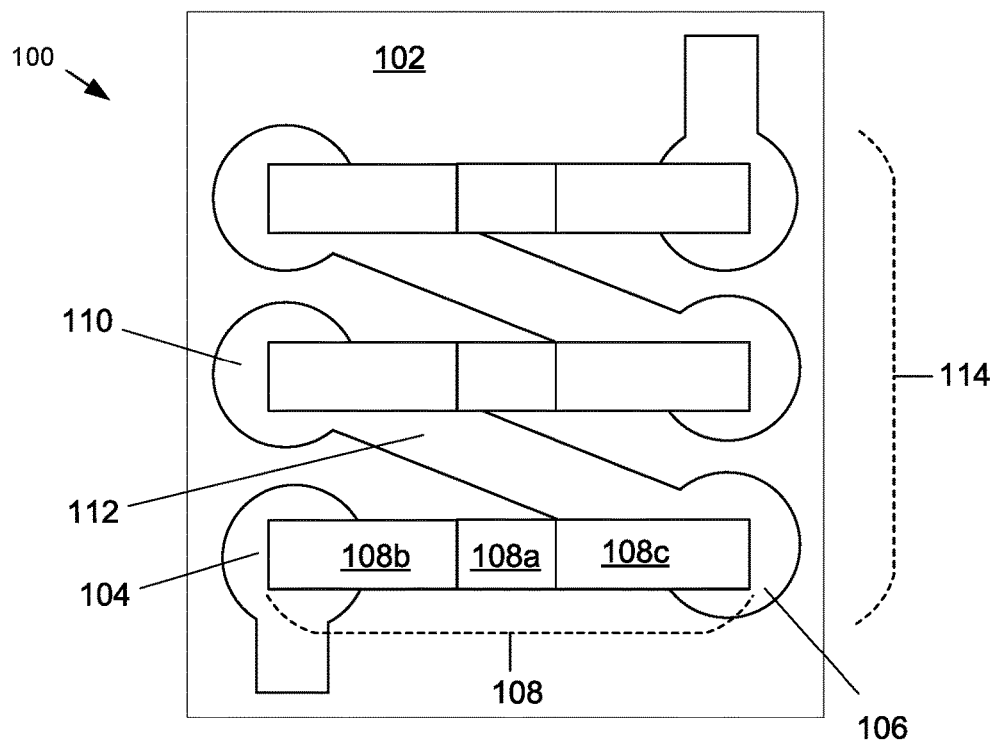

With reference to FIGS. 1-2, an embodiment of an IC package 100 may include a dielectric material 102, a first metal pad 104 embedded in the dielectric material 102, a second metal pad 106 embedded in the dielectric material 102 and spaced from the first metal pad 104 (e.g., with a spacing generally much less than one tenth millimeter (0.1 mm), on the order of 5-10 micrometer (um)). A surface of the first metal pad 104 is substantially co-planar with a surface of the second metal pad 106. The package further includes a first metal trace 108 embedded in the dielectric material 102 and attached between the first and second metal pads 104, 106, where a middle portion 108a of the first metal trace 108 has a surface that is above (e.g., non-co-planar with) the co-planar surfaces of the first and second metal pads 104, 106 (e.g., at a maximum height less than 1 mm from the co-planar surfaces of the first and second metal pads, and generally on the order of tens of um to a few hundred um). As shown in FIG. 1, a first trace portion 108b of the first metal trace 108 has a surface that is angled (e.g., at a non-perpendicular angle and a non-parallel angle relative) to the co-planar surfaces of the first and second metal pads 104, 106.

As illustrated, the first trace portion 108b of the first metal trace 108 is substantially straight, and a second trace portion 108c of the first metal trace 108 is also substantially straight. A first end of the first trace portion 108b is attached to the first metal pad 104, a second end of the first trace portion 1080b is attached to a first end of the second trace portion 108c, a second end of the second trace portion 108c is attached to the second metal pad 106, and the middle portion 108a (e.g., where the second end of the first trace portion 108b is attached to the first end of the second trace portion 108c) is spaced from the co-planar surfaces of the first and second metal pads 104, 106 (e.g., at the maximum height of less than 1 mm).

In some embodiments, the first metal trace 108 may be used as an angled connection between the first metal pad 104 and a second metal pad alone (e.g., not as part of an inductor). For example, such an angled connection may be useful to lengthen a signal line to match impedance or delay with another signal line.

In some embodiments, however, the first metal trace 108 may be used as part of an angled inductor. For example, the IC package 100 further includes a third metal pad 110 embedded in the dielectric material 102 and spaced from the first and second metal pads 104, 106 (e.g., where a surface of the third metal pad 110 is substantially co-planar with the surfaces of the first and second metal pads 104, 106), and a second metal trace 112 embedded in the dielectric material 102 and attached between the second metal pad 106 and the third metal pad 110 (e.g., where a surface of the second metal trace 112 is substantially co-planar with the surfaces of the first, second, and third metal pads 104, 106, and 110). As shown in FIGS. 1-2, the IC package 100 further includes multiple loops of an inductor 114 embedded in the dielectric material 102 (e.g., two and a half loops are illustrated as attached to each other in series). Each of the illustrated loops of the inductor 114 has three sides. For example, one loop comprises the first trace portion 108b of the first metal trace 108, the second trace portion 108c of the first metal trace 108, and the second metal trace 112, in a general triangular arrangement. An interior angle between the first and second trace portions 108b, 108c of the first metal trace 108 may be any useful angle, and may generally be between thirty (30) degrees and one hundred twenty (120) degrees.

In some embodiments, the dielectric material 102 may comprise a single layer of a substrate of the IC package 100. For example, the dielectric material 102 may comprise a single BUF layer of the IC package 100. The inductor 114 may have a small form factor. For example, the second metal pad 106 may be spaced less than 100 um from the first metal pad 104, and the middle portion 108a of the first metal trace 108 may be spaced from the surfaces of the first and second metal pads 104, 106 at a height of less than 200 um.

Figure 3:
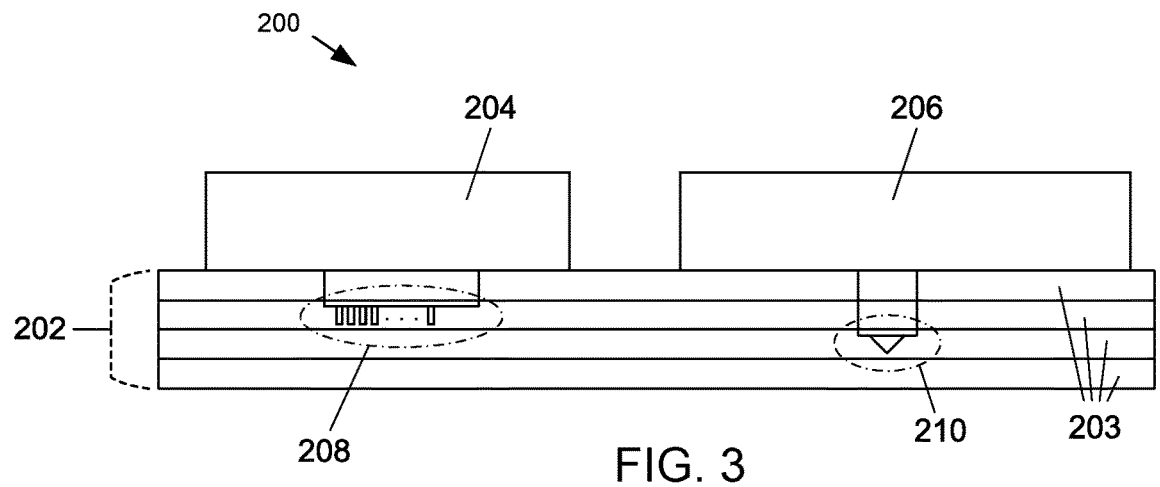
FIG. 3 is a side view of an integrated circuit package, according to an embodiment of the present description.

With reference to FIG. 3, an embodiment of an IC package 200 may include a substrate 202 that comprises one or more layers 203 of dielectric material, one or more IC chips (e.g., ICs 204 and 206) attached to a first side of the substrate 202, and one or more inductors (e.g., inductors 208 and 210) embedded in the dielectric material of the substrate 202. As shown, the inductor 208 includes multiple loops from left to right, while the inductor 210 includes multiple loops from front to back. Any of the inductors in the IC package 200 may include one or more features or aspects of the embedded angled inductors described herein and may be coupled to the one or more IC chips 204, 206 (e.g., or other active or passive components in the IC package 200).

In some embodiments, one or more of the embedded inductors 208 and 210 may comprise a plurality of at least three-sided (e.g., 3-sided, 4-sided, or more) metal loops embedded in the dielectric material of the substrate 202. For example, the inductor 210 may comprise a plurality of 3-sided metal loops (e.g., a triangular inductor) as shown in FIGS. 1-2. For example, two sides of the metal loops may have a general V shape from the angled sides of the triangular inductor 210 and the third side may be traces that are co-planar with other metallization features of the layer of the substrate 202. Although only 2.5 loops are shown in FIGS. 1-2, the triangular inductor 210 may comprise any useful number of loops to provide a desired inductance value. For example, the triangular inductor 210 embedded in the dielectric material of the substrate 202 may have a small form factor (e.g., with features ranging from less than 10 um up to a few hundred um) with an inductance density of greater than 10 nH/mm$^2$ (e.g., up to about 40 nH/mm$^2$ or more in some embodiments).

Figure 4:
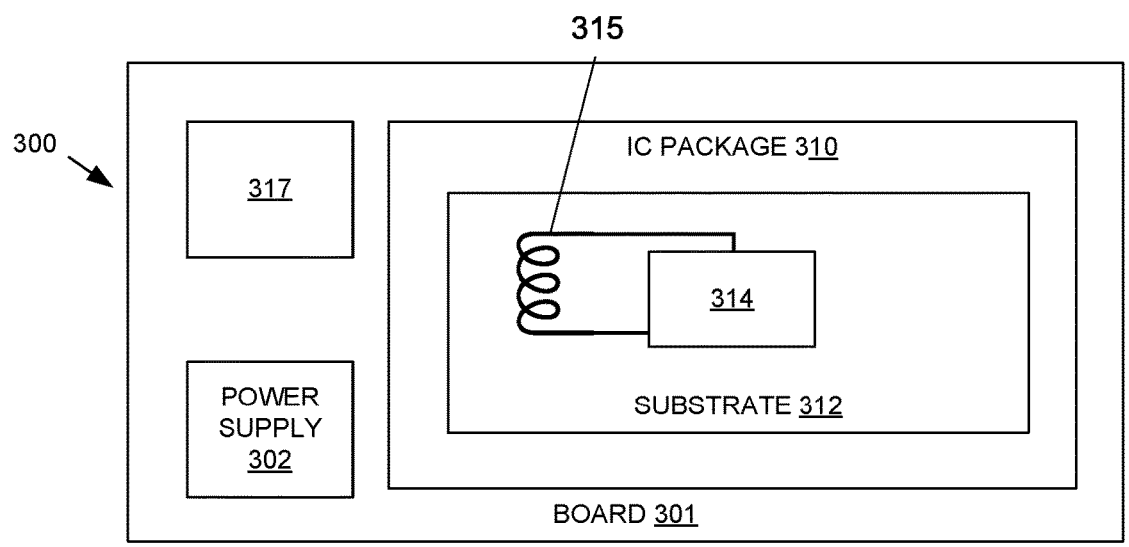
FIG. 4 is an electronic system, according to one embodiment of the present description.

With reference to FIG. 4, an embodiment of an electronic system 300 may include a board 301, a power supply 302 to provide power to one or more IC chips, and an IC package 310 coupled to the board 301 and the power supply 302. The IC package 310 may comprise a substrate 312 that comprises a dielectric material, one or more IC chips 314 attached to a first side of the substrate, and a small form factor multi-sided inductor 315 embedded in the dielectric material of the substrate 312. The multi-sided inductor 315 may include one or more features or aspects of the embedded angled inductors described herein and may be coupled to one or more of the IC chips 314 (e.g., or other active or passive components in the IC package 310). In some embodiments, a cross section of the package substrate 312 shows a characteristically angled geometry to form the loops of the inductor 315 (e.g., triangular, trapezoidal, parallelogram, etc.). The system 300 may further include one or more additional components 317 coupled to the board 301.

For example, the multi-sided inductor 315 may comprise a triangular inductor as described herein (e.g., where one turn of the inductor comprises a V-shaped metal trace attached to another metal trace that is co-planar with other metallization features of a layer of the substrate 312). In some embodiments, an interior angle of the V-shaped metal trace may be between thirty degrees and one hundred twenty degrees, and the triangular inductor 315 may comprise ten or more turns that each comprise respective metal traces together with respective V-shaped traces embedded in the dielectric material of the substrate 312.

Figure 5:
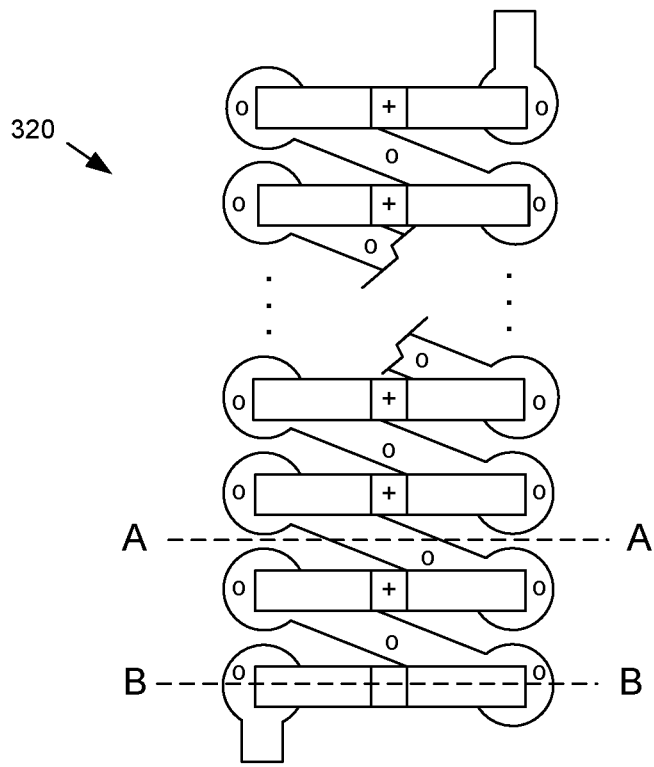
FIG. 5 is a top view of another angled inductor, according to one embodiment of the present description.
Figure 6:
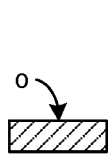
FIGS. 6 and 7 are side cross-sectional views of an angled inductor, taken along lines A-A and B-B from FIG. 3, respectively.
Figure 7:
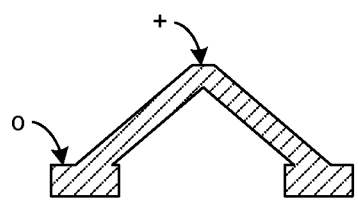

As shown in FIGS. 5 to 7, an embodiment of an inductor architecture 320 may include triangular inductor loops. In other embodiments, a variety of other structures may be utilized with angled sides of the inductor loop. As illustrated, the "o" denotes copper features on the metallization plane (e.g., see cross sections at lines A and B at FIGS. 6 and 7, respectively) and the "+" denotes a protruded copper feature (e.g., features above the metallization plane, see cross section at line B at FIG. 7).

Any known process may be utilized to form angled copper features embedded in a dielectric material. FIGS. 8 to 13 show an embodiment of a process 340 that utilize zero misaligned triangular (ZMT) patterning to fabricate an integrated circuit package with angled traces. For example, a suitable ZMT process utilizes an angled patterning process where readily available substrate manufacturing tools and/or infrastructure are used together with a set of prisms 342, 343, and 344 to create angled exposures. In some embodiments, the ZMT patterning process 340 can create either triangular type vias or traces. In some embodiments, a ZMT patterning process can be used to form the angled trace within a single BUF.

Figure 8:
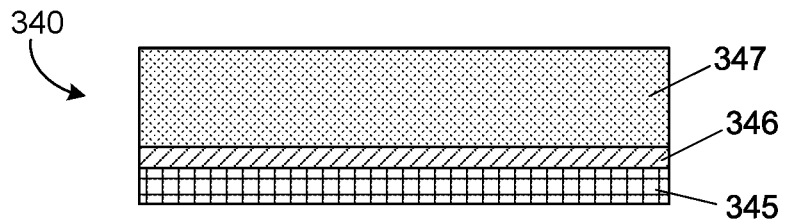
FIGS. 8-13 are side cross-sectional views of a process for fabrication of an integrated circuit package, according to an embodiment of the present description.
Figure 9:
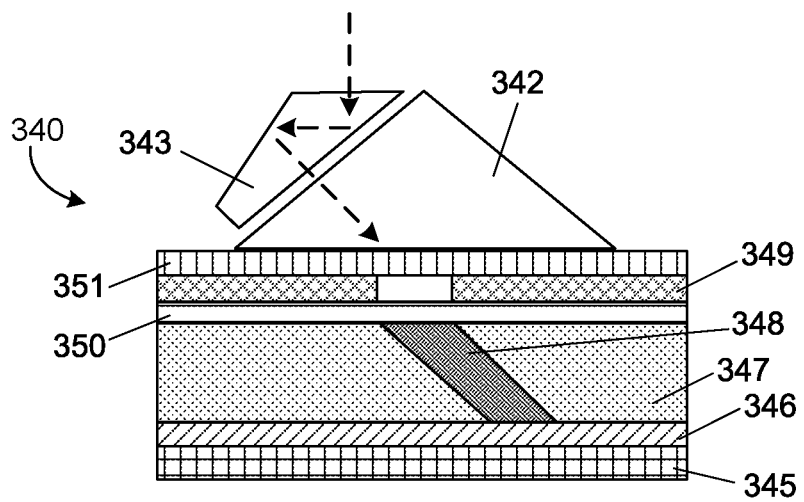
Figure 10:
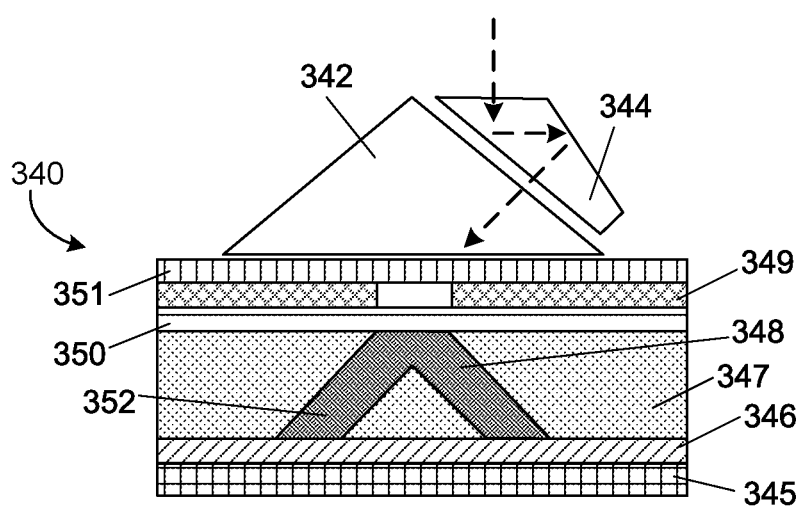

In FIG. 8, an arbitrary substrate pattern (e.g., or stage) 345 includes a metal seed (e.g., a copper seed) layer 346 and a positive resist laminate layer 347 thereon. In FIG. 9, a lithography process is used to expose a first portion 348 of the resist layer 347 at an angle. For example, a right angle prism 342 and a first half-penta prism 343 are arranged to direct an optical path through an opening in a mask layer 349 with an angled exposure to create patterned features that extend into the resist layer 347 in a non-orthogonal direction to a surface of the resist layer 347. There may be an air gap between the two prisms 342 and 343, and the process may include other layers such as a water layer 350 and an index matching gel layer 351. In FIG. 10, a lithography process is used to expose a second portion 352 of the resist layer 347 at another angle. For example, the right angle prism 342 and a second half-penta prism 344 are arranged to direct another optical path through the same opening(s) in the mask layer 349 with an angled exposure to create patterned features that extend into the resist layer 347 in a non-orthogonal direction to a surface of the resist layer 347, at a different angle. There may be an air gap between the two prisms 342 and 344. In some embodiments, both prisms 343 and 344 may be simultaneously arranged as shown such that both portions 348 and 352 of the resist layer may have an angled exposure at the same time (e.g., see FIG. 17 below). Those skilled in the art will appreciate that FIGS. 8 to 13 are illustrative and not photo-realistic, particularly with respect to the optical paths.

Figure 11:
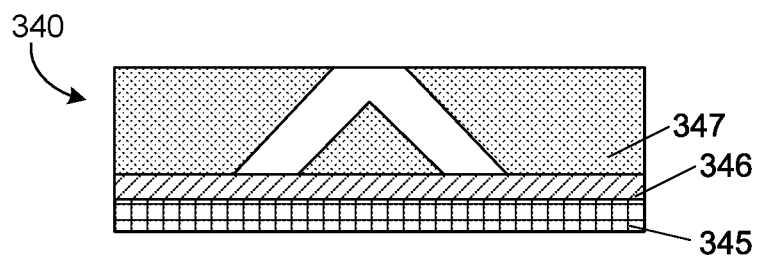
Figure 12:
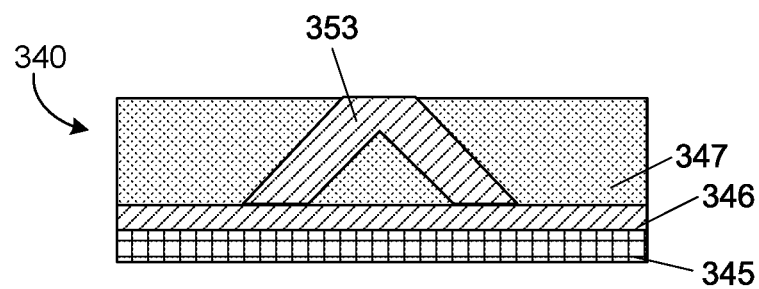
Figure 13:
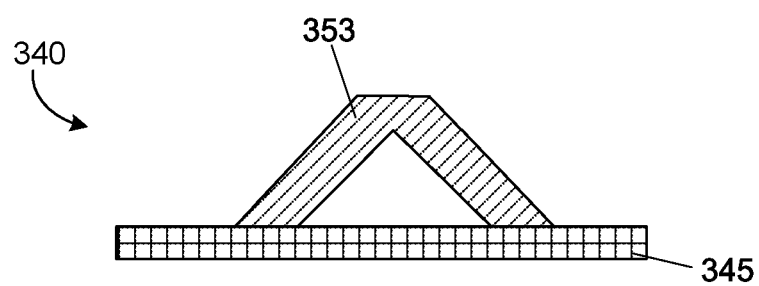

In FIG. 11, the resist layer 347 is developed to remove the exposed resist material including the angled portions 348 and 352. In FIG. 12, the process 340 includes a semi-additive plating (SAP) process to fill the removed resist with a metal (e.g., copper) trace 353. In FIG. 13, the resist layer 347 is removed by, for example, a resist strip process, and a copper flash etch process removes unprotected portions of the metal seed layer 346, leaving the metal trace 353 on the substrate 345.

Any known process may be utilized to form a multi-sided angled inductor embedded in a dielectric material. For example, the process 340 may be utilized to fabricate the angled sides of a multi-sided angled inductor. In some embodiments, a ZMT patterning process can be used to form the angled inductor within a single BUF. FIGS. 14 to 20 show an embodiment of a process 400 that utilizes ZMT patterning to fabricate an integrated circuit package with an angled inductor, where a top view is show to the left of a cross sectional view taken along the line in the adjacent top view in each of FIGS. 14 to 20.

Figure 14:
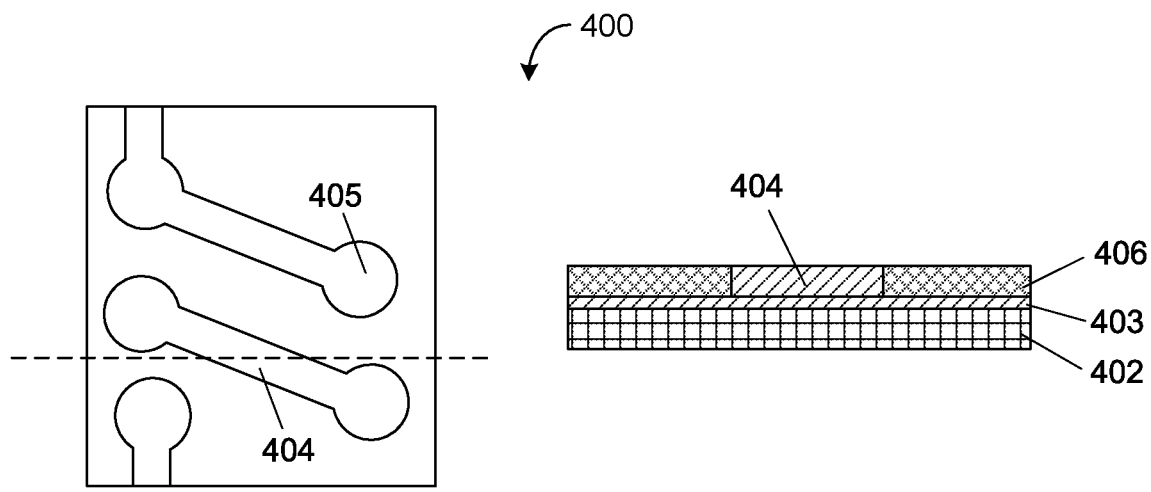
FIGS. 14-20 are top views and side cross-sectional views of another process for fabrication of an integrated circuit package, according to an embodiment of the present description.
Figure 15:
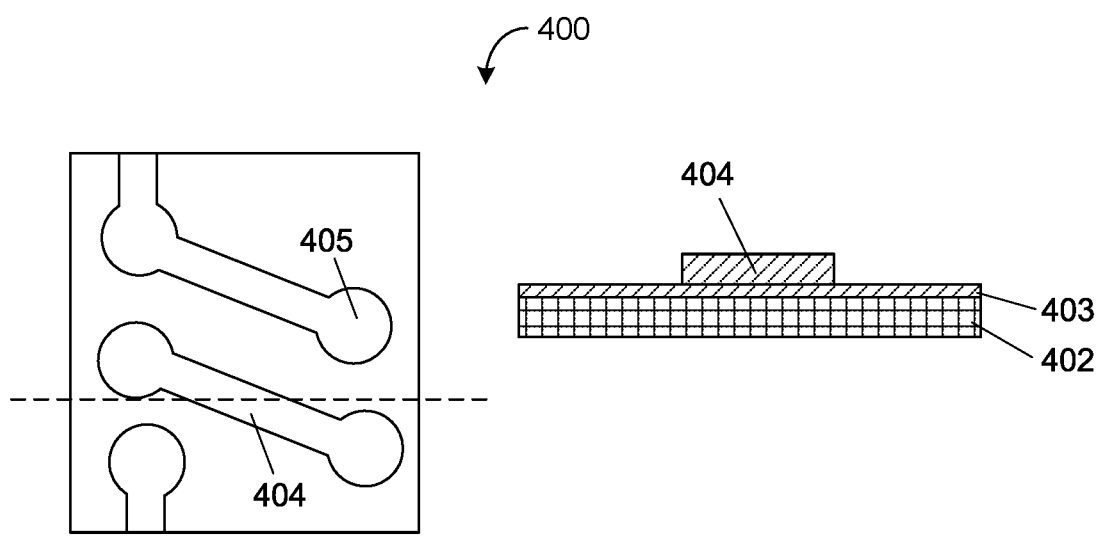

In FIGS. 14 to 15, any known process may be utilized to form a pattern of metal traces on a substrate. For example, starting from a substrate 402 with a copper seed layer 403 thereon, a metal layer may be patterned with traces 404 and landing pads 405 of the inductor loop connections using a negative resist 406 and SAP process (e.g., negative resist lamination, mask, expose, develop, plate; see FIG. 14). The resist layer 406 is then removed (see FIG. 15), leaving the metal seed layer 403 and the metallization features of the metal layer that includes the inductor traces 404 and landing pads 405.

Figure 16:
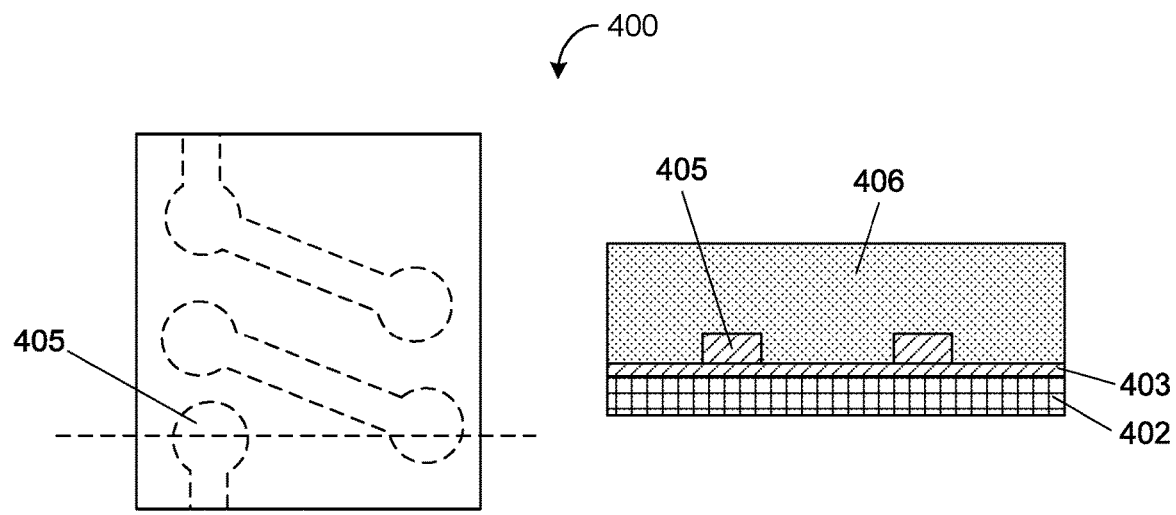
Figure 17:
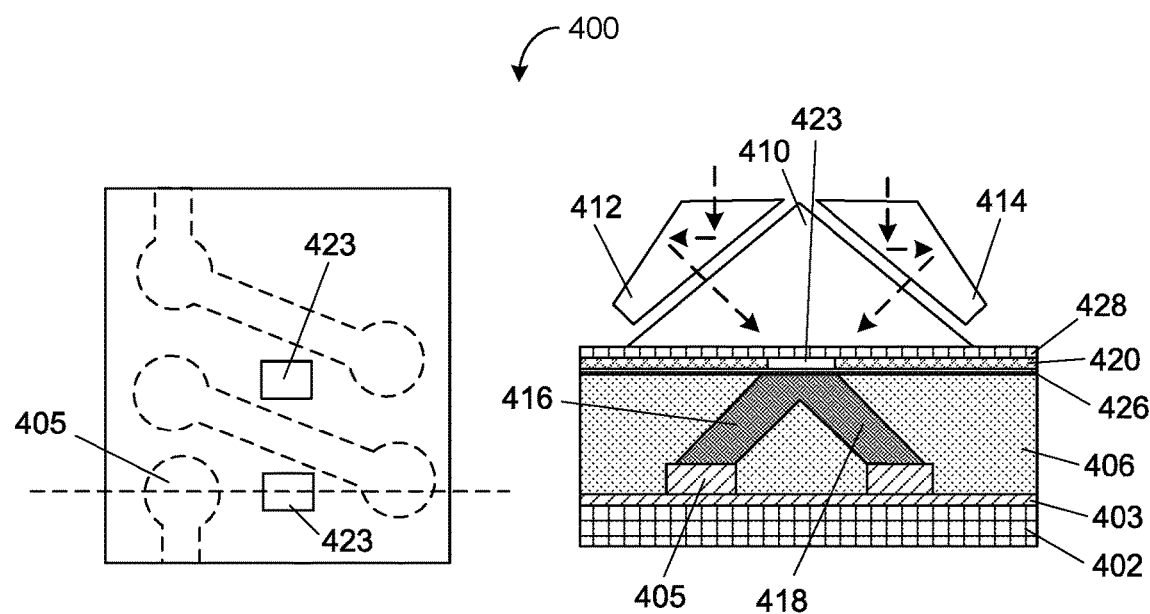

In FIGS. 16 to 17, a laminate positive resist layer 406 is added over the patterned traces and landing pads (see FIG. 16), and an angled exposure process utilizes a right angled prism 410 simultaneously with two half-penta prisms 412 and 414 to direct two opposing optical paths that expose portions 416 and 418 of the resist layer 406 through a mask layer 420 with mask openings 423, with the exposure going down to the landing pads 405 of the inductor loop (see FIG. 17). The half-penta prism 412 on the left exposes the right portion 418 of the inductor loop and the half-penta prism 414 on the right exposes the left portion 416 of the inductor loop. There may be respective air gaps between the right angle prism 410 and the two half-penta prisms 412 and 414, and the process 400 may include other layers such as a water layer 426 and an index matching gel layer 428. Those skilled in the art will appreciate that FIGS. 14 to 20 are illustrative and not photo-realistic, particularly with respect to the optical paths.

Figure 18:
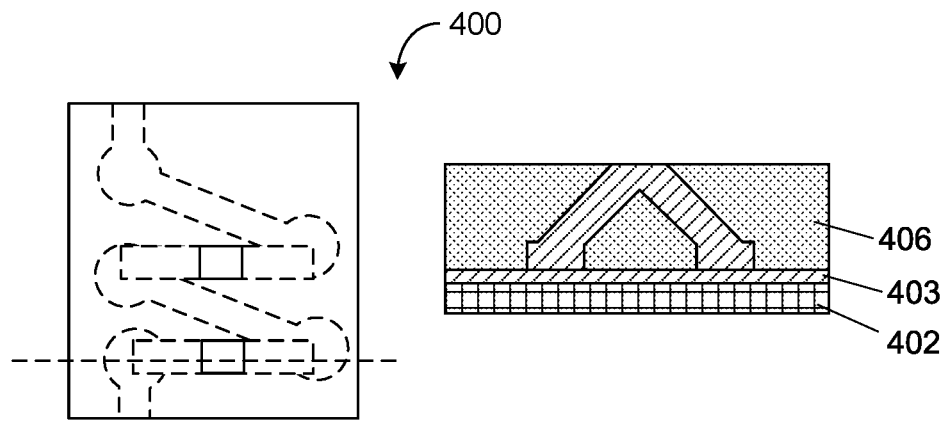
Figure 19:
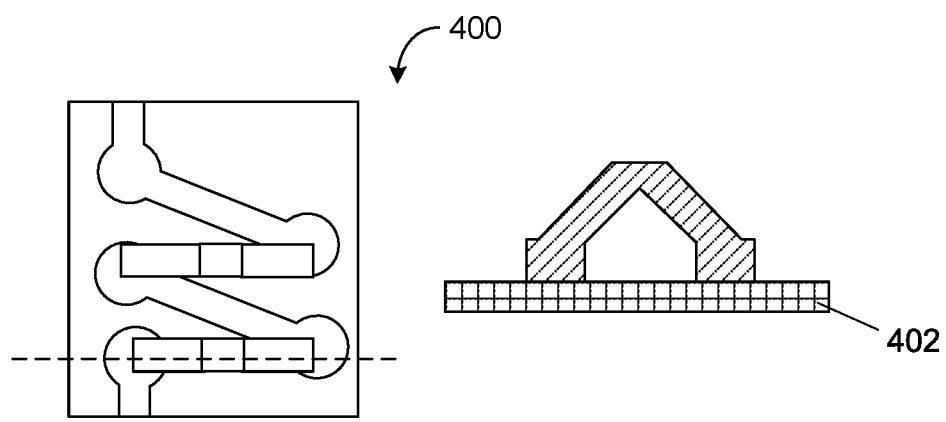
Figure 20:
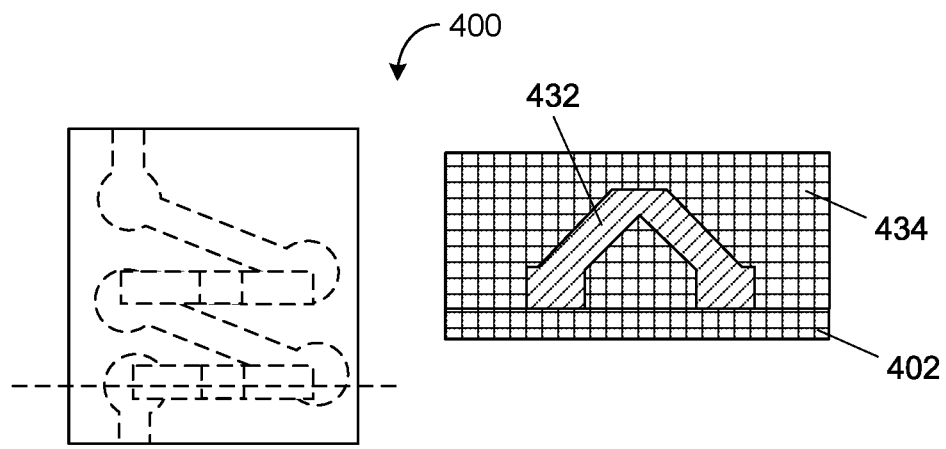

In FIGS. 18 to 20, the exposed portions are developed, the developed portions are removed (e.g., with a soluble positive resist process), and the voids are plated to provide an angled metal trace 432 between the landing pads 405 that provide two, V-shaped sides of the inductor loop (e.g., with the metal trace 404 providing the third side of the inductor loop; see FIG. 18). The resist layer 406 is then removed (e.g., with a positive resist strip process) and the metal seed layer 403 is removed (e.g., by a copper flash etch process; see FIG. 19), leaving the angled inductor loops on the substrate 402. An additional dielectric lamination process then embeds the inductor loop in a dielectric material layer 434. In the illustrated example, the thickness of the dielectric material layer 434 may be greater than the thickness of the resist layer 406, to embed the inductor loop(s) within the dielectric material layer 434 (e.g., as a single build-up layer on the substrate 402), but other thicknesses and variations may be used. Advantageously, only two lithography steps are utilized to fabricate the embedded angled inductor. Additional metallization layers may be fabricated above the dielectric material layer 434 (e.g., and/or below the substrate layer 402).

Figure 21:
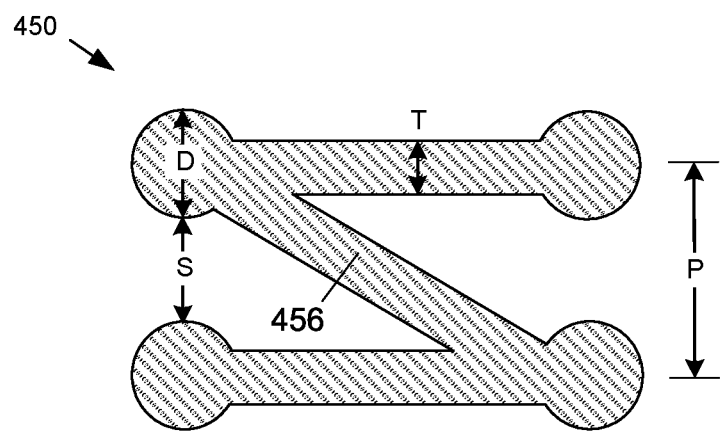
FIGS. 21 and 22 are top and side views of one turn of a triangular inductor, according to embodiments of the present description.
Figure 22:
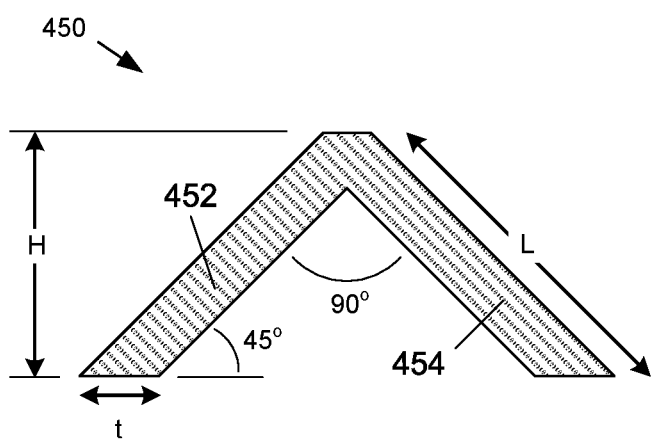

Without being limited to theory of operation, FIGS. 21 and 22 show example dimensions that may guide configuration of a triangular inductor 450 in accordance with some embodiments. The triangular inductor 450 includes three-sided inductor loops with two angled sides 452 and 454 connected to and protruding above a third side 456 on the metallization layer. Table 1 shows example values for the various dimensions together with estimated inductance values.

TABLE 1

| Coil Type | S (um) | T (um) | D (um) | L (um) | H (um) | P (um) | # of loops | Area (um$^2$) | Inductance (nH) | Inductance Density (nH/mm$^2$) |
|---|---|---|---|---|---|---|---|---|---|---|
| Thin | 7 | 9 | 15 | 45 | 31.5 | 22 | 50 | 992.25 | 2.7 | 39.3 |
| Thick | 7 | 30 | 36 | 150 | 105 | 43 | 50 | 11025 | 15.8 | 34.3 |

In some implementations, T may range between about 9 and 30 um, D may range between about 15 and 36 um, L may range between about 45 and 150 um, and H may range between about 31.5 and 105 um. An example minimum size of the landing pads, Dmin, may corresponds to the lowest value of T plus some offset O (e.g., Dmin=Tmin+O). For O=6 um, for example, Dmin=9 um+6 um=15 um. An example minimum spacing between the landing pads, Smin, may be about 7 um. An example minimum loop spacing, Pmin, may correspond to the minimum pad size plus the minimum spacing (e.g., Pmin=Dmin+Smin). For a 5:1 aspect ratio, a maximum length, Lmax, may correspond to five times a thickness "t" of the two angled sides 452, 454 (Lmax=5*t). For a 45 degree interior angle between the two sides and the metallization layer, a maximum height, Hmax, may correspond to sin of the interior angle times the length (e.g., Hmax=sin(45)*L=~0.7*L).

Figure 23:
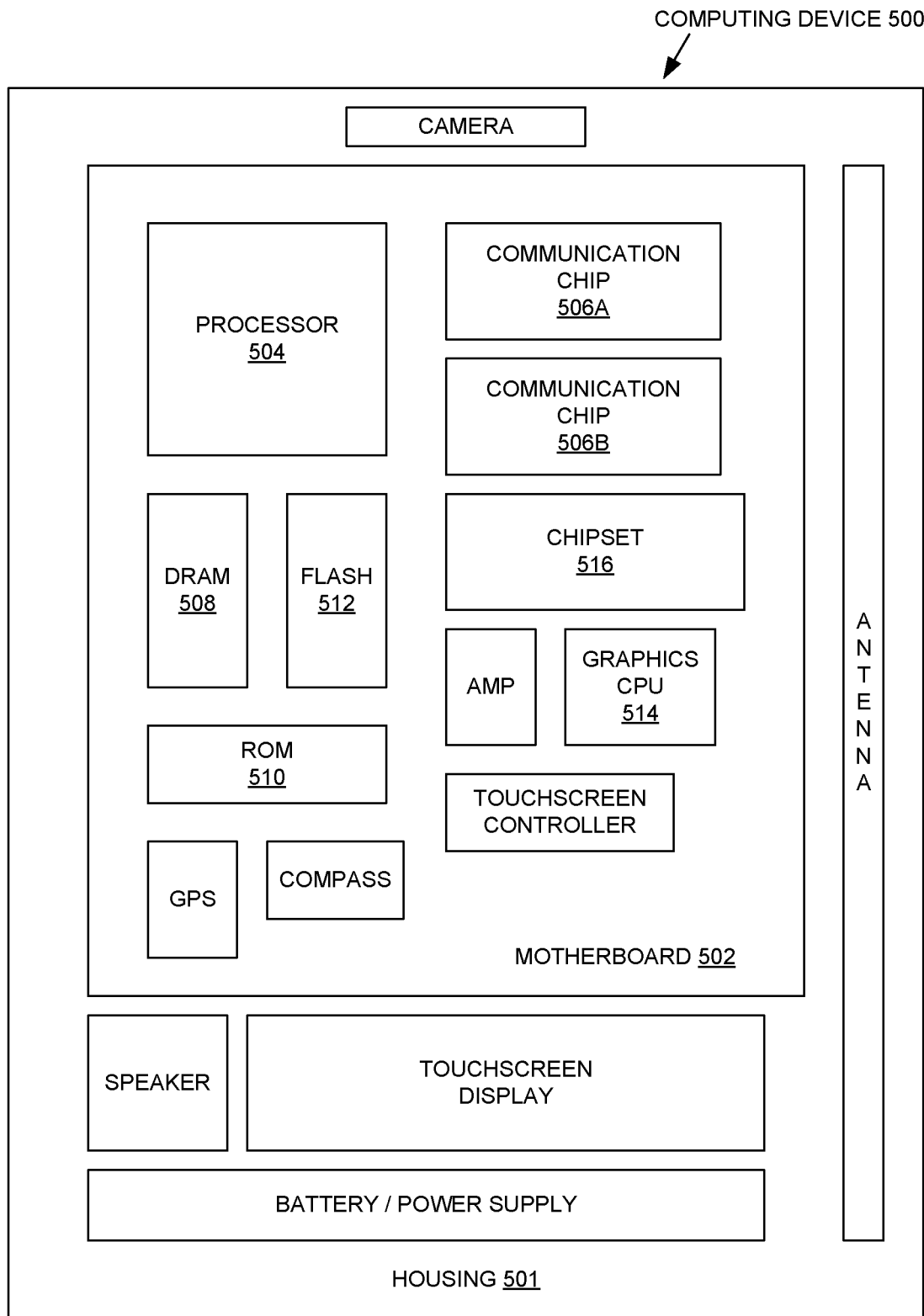
FIG. 23 is an electronic system, according to one embodiment of the present description.

FIG. 23 illustrates an electronic or computing device 500 in accordance with one implementation of the present description. The computing device 500 may include a housing 501 having a board 502 disposed therein. The computing device 500 may include a number of integrated circuit components, including but not limited to a processor 504, at least one communication chip 506A, 506B, volatile memory 508 (e.g., DRAM), non-volatile memory 510 (e.g., ROM), flash memory 512, a graphics processor or CPU 514, a digital signal processor (not shown), a crypto processor (not shown), a chipset 516, an antenna, a display (touchscreen display), a touchscreen controller, a battery/power supply, an audio codec (not shown), a video codec (not shown), a power amplifier (AMP), a global positioning system (GPS) device, a compass, an accelerometer (not shown), a gyroscope (not shown), a speaker, a camera, and a mass storage device (not shown) (such as hard disk drive, compact disk (CD), digital versatile disk (DVD), and so forth). Any of the integrated circuit components may be physically and electrically coupled to the board 502. In some implementations, at least one of the integrated circuit components may be a part of the processor 504.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

At least one of the integrated circuit components may include an integrated circuit package including one or more of an embedded angled trace or an embedded multi-sided angled inductor (e.g., and one or more of the other features or aspects of the embodiments described herein).

In various implementations, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-23. The subject matter may be applied to other integrated circuit devices and assembly applications, as well as any appropriate electronic application, as will be understood to those skilled in the art.

The follow examples pertain to further embodiments and specifics in the examples may be used anywhere in one or more embodiments, wherein Example 1 is an apparatus comprising a dielectric material, a first metal pad embedded in the dielectric material, a second metal pad embedded in the dielectric material and spaced less than one tenth millimeter from the first metal pad, wherein a surface of the first metal pad is substantially co-planar with a surface of the second metal pad, and a first metal trace embedded in the dielectric material and attached between the first and second metal pads, wherein a first surface of the first metal trace is non-co-planar with the co-planar surfaces of the first and second metal pads at a maximum height of less than one millimeter from the co-planar surfaces of the first and second metal pads, and wherein a second surface of the first metal trace is angled at a non-perpendicular angle and a non-parallel angle relative to the co-planar surfaces of the first and second metal pads.

In Example 2, the subject matter of Example 1 can optionally include the first metal trace comprising a first trace portion that is substantially straight, and a second trace portion that is substantially straight, wherein a first end of the first trace portion is attached to the first metal pad, a second end of the first trace portion is attached to a first end of the second trace portion, a second end of the second trace portion is attached to the second metal pad, and where the second end of the first trace portion is attached to the first end of the second trace portion is spaced from the co-planar surfaces of the first and second metal pads at the maximum height of less than one millimeter from the co-planar surfaces of the first and second metal pads.

In Example 3, the subject matter of Example 2 can optionally include a third metal pad embedded in the dielectric material and spaced from the first and second metal pads, wherein a surface of the third metal pad is substantially co-planar with the co-planar surfaces of the first and second metal pads, and a second metal trace embedded in the dielectric material and attached between the second metal pad and the third metal pad, wherein a surface of the second metal trace is substantially co-planar with the co-planar surfaces of the first, second, and third metal pads.

In Example 4, the subject matter of Example 3 can optionally include a plurality of loops of an inductor embedded in the dielectric material and attached to each other in series, wherein at least one of the plurality of loops of the inductor has three sides that comprises the first trace portion of the first metal trace, the second trace portion of the first metal trace, and the second metal trace.

In Example 5, the subject matter of Example 4 can optionally include an interior angle between the first and second trace portions of the first metal trace being between thirty degrees and sixty degrees.

In Example 6, the subject matter of any of Examples 4 to 5 can optionally include the dielectric material comprising a single layer of a substrate of an integrated circuit package.

In Example 7, the subject matter of any of Examples 4 to 5 can optionally include the dielectric material comprising a single build-up film layer of an integrated circuit package.

In Example 8, the subject matter of any of Examples 1 to 7 can optionally include the second metal pad being spaced less than 10 micrometers from the first metal pad.

In Example 9, the subject matter of any of Examples 1 to 8 can optionally include the first surface of the first metal trace being non-co-planar with the co-planar surfaces of the first and second metal pads at a maximum height of less than 200 micrometers from the co-planar surfaces of the first and second metal pads.

Example 10 is an apparatus comprising a substrate that comprises a dielectric material, one or more integrated circuit (IC) chips attached to a first side of the substrate, and an inductor embedded in the dielectric material of the substrate, wherein the embedded inductor comprising a plurality of three-sided metal loops embedded in the dielectric material of the substrate.

In Example 11, the subject matter of Example 10 can optionally include at least one of the plurality of three-sided metal loops comprising a first metal pad embedded in the dielectric material of the substrate, a second metal pad embedded in the dielectric material of the substrate and spaced less than one tenth millimeter from the first metal pad, wherein a surface of the first metal pad is substantially co-planar with a surface of the second metal pad, a first side of a three-sided metal loop embedded in the dielectric material of the substrate and attached at a first end to the first metal pad, wherein a surface of the first side is at a non-zero angle with respect to the co-planar surfaces of the first and second metal pads, and a second side of the three-sided metal loop embedded in the dielectric material of the substrate, attached at a first end to a second end of the first side of the three-sided metal loop, and attached at a second end to the second metal pad, wherein a surface of the second side is at a non-zero angle with respect to the co-planar surfaces of the first and second metal pads, and where the second end of the first side of the three-sided metal loop is attached to the first end of the second side of the three-sided metal loop at a maximum height of less than one millimeter from the co-planar surfaces of the first and second metal pads.

In Example 12, the subject matter of Example 11 can optionally include an interior angle of the first and second sides of the three-sided metal loop being between thirty degrees and one hundred thirty five degrees.

In Example 13, the subject matter of any of Examples 11 to 12 can optionally include the at least one of the plurality of three-sided inductor loops further comprising a third metal pad embedded in the dielectric material of the substrate and spaced from the first and second metal pads, wherein a surface of the third metal pad is substantially co-planar with the co-planar surfaces of the first and second metal pads, and a third side of the three-sided metal loop embedded in the dielectric material of the substrate and attached between the second metal pad and the third metal pad, wherein a surface of the third side is substantially co-planar with the co-planar surfaces of the first, second, and third metal pads.

In Example 14, the subject matter of any of Examples 10 to 13 can optionally include the inductor embedded in the dielectric material of the substrate having an inductance density of greater than 10 nano-henries per square millimeter.

Example 15 is an electronic system comprising a board, a power supply to provide power to one or more integrated circuit (IC) chips, and an IC package electrically attached to the board and the power supply, wherein the IC package comprises a substrate that comprises a dielectric material, one or more integrated circuit (IC) chips attached to a first side of the substrate, and a triangular inductor embedded in the dielectric material of the substrate.

In Example 16, the subject matter of Example 15 can optionally include the triangular inductor comprising a first metal pad embedded in the dielectric material of the substrate, a second metal pad embedded in the dielectric material of the substrate and spaced less than one tenth millimeter from the first metal pad, wherein a surface of the first metal pad is substantially co-planar with a surface of the second metal pad, and a V-shaped metal trace embedded in the dielectric material of the substrate and attached between the first and second metal pads, wherein a first end of the V-shaped metal trace is attached to the first metal pad, a second end of the V-shaped metal trace is attached to the second metal pad, and where a middle of the V-shaped metal trace is non-planar relative to the co-planar surfaces of the first and second metal pads at a maximum height of less than one millimeter from the co-planar surfaces of the first and second metal pads.

In Example 17, the subject matter of Example 16 can optionally include an interior angle of the V-shaped metal trace being between thirty degrees and one hundred thirty five degrees.

In Example 18, the subject matter of any of Examples 16 to 17 can optionally include the triangular inductor comprising a third metal pad embedded in the dielectric material of the substrate and spaced from the first and second metal pads, wherein a surface of the third metal pad is substantially co-planar with the co-planar surfaces of the first and second metal pads, and a metal trace embedded in the dielectric material of the substrate and attached between the second metal pad and the third metal pad, wherein a surface of the metal trace is substantially co-planar with the co-planar surfaces of the first, second, and third metal pads.

In Example 19, the subject matter of Example 18 can optionally include one turn of the triangular inductor comprising the metal trace together with the V-shaped trace.

In Example 20, the subject matter of any of Examples 18 to 19 can optionally include the triangular inductor comprising ten or more turns that each comprise respective metal traces together with respective V-shaped traces embedded in the dielectric material of the substrate.

In Example 21, the subject matter of any of Examples 16 to 20 can optionally include the dielectric material comprising a single layer of a substrate of the IC package.

In Example 22, the subject matter of any of Examples 16 to 20 can optionally include the dielectric material comprising a single build-up film layer of the IC package.

Example 23 is an apparatus comprising a substrate that comprises a dielectric material, one or more integrated circuit (IC) chips attached to a first side of the substrate, and an angled trace embedded in the dielectric material of the substrate, wherein a first end of the angled trace is attached to a first metallization feature of the substrate, at least a portion of a surface of the angled trace is non-coplanar with the first metallization feature, and a second end of the angled trace is attached to a second metallization of the substrate.

In Example 24, the subject matter of Example 23 can optionally include the first and second metallization features being co-planar on a layer of the substrate.

In Example 25, the subject matter of any of Examples 23 to 24 can optionally include the dielectric material comprising a single layer of a substrate of an integrated circuit package.

In Example 26, the subject matter of any of Examples 23 to 24 can optionally include the dielectric material comprising a single build-up film layer of an integrated circuit package.

Example 27 is an electronic system comprising a board, a power supply to provide power to one or more integrated circuit (IC) chips, and an IC package electrically attached to the board and the power supply, wherein the IC package comprises a substrate that comprises a dielectric material, one or more integrated circuit (IC) chips attached to a first side of the substrate, and a multi-sided inductor embedded in the dielectric material of the substrate.

In Example 28, the subject matter of Example 27 can optionally include the multi-sided inductor comprising three or more metal sides embedded in the dielectric material of the substrate.

In Example 29, the subject matter of Example 28 can optionally include at least one side of three or more metal sides comprising an angled trace embedded in the dielectric material of the substrate.

In Example 30, the subject matter of any of Examples 27 to 29 can optionally include the multi-sided inductor comprising ten or more turns embedded in a single layer of the substrate of the IC package.

In Example 31, the subject matter of any of Examples 27 to 29, the multi-sided inductor comprising ten or more turns embedded in a single build-up film layer of the IC package.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. An apparatus, comprising:
   a first metal pad embedded in a dielectric material;
   a second metal pad embedded in the dielectric material and spaced less than one tenth millimeter from the first metal pad, wherein a surface of the first metal pad is substantially co-planar with a surface of the second metal pad; and
   a first metal trace embedded in the dielectric material and attached between the first and second metal pads, wherein a first surface of the first metal trace is non-co-planar with the co-planar surfaces of the first and second metal pads at a maximum height of less than one millimeter from the co-planar surfaces of the first and second metal pads, and wherein a second surface of the first metal trace is angled at a non-perpendicular angle and a non-parallel angle relative to the co-planar surfaces of the first and second metal pads.

2. The apparatus of claim 1, wherein the first metal trace comprises:
   a first trace portion that is substantially straight; and
   a second trace portion that is substantially straight, wherein a first end of the first trace portion is attached to the first metal pad, a second end of the first trace portion is attached to a first end of the second trace portion, a second end of the second trace portion is attached to the second metal pad, and wherein the second end of the first trace portion is attached to the first end of the second trace portion is spaced from the co-planar surfaces of the first and second metal pads at the maximum height of less than one millimeter from the co-planar surfaces of the first and second metal pads.

3. The apparatus of claim 2, further comprising:
a third metal pad embedded in the dielectric material and spaced from the first and second metal pads, wherein a surface of the third metal pad is substantially co-planar with the co-planar surfaces of the first and second metal pads; and
a second metal trace embedded in the dielectric material and attached between the second metal pad and the third metal pad, wherein a surface of the second metal trace is substantially co-planar with the co-planar surfaces of the first, second, and third metal pads.

4. The apparatus of claim 3, further comprising:
a plurality of loops of an inductor embedded in the dielectric material and attached to each other in series, wherein at least one of the plurality of loops of the inductor has three sides that comprising the first trace portion of the first metal trace, the second trace portion of the first metal trace, and the second metal trace.

5. The apparatus of claim 4, wherein an interior angle between the first and second trace portions of the first metal trace is between thirty degrees and sixty degrees.

6. The apparatus of claim 4, wherein the dielectric material comprises a single layer of a substrate of an integrated circuit package.

7. The apparatus of claim 4, wherein the dielectric material comprises a single build-up film layer of an integrated circuit package.

8. The apparatus of claim 1, wherein the second metal pad is spaced less than 10 micrometers from the first metal pad.

9. The apparatus of claim 1, wherein the first surface of the first metal trace is non-co-planar with the co-planar surfaces of the first and second metal pads at a maximum height of less than 200 micrometers from the co-planar surfaces of the first and second metal pads.

* * * * *